United States Patent
Toyoda et al.

(10) Patent No.: US 8,912,669 B2
(45) Date of Patent: Dec. 16, 2014

(54) SEALING RESIN SHEET, METHOD FOR PRODUCING ELECTRONIC COMPONENT PACKAGE AND ELECTRONIC COMPONENT PACKAGE

(71) Applicant: Nitto Denko Corporation, Ibaraki (JP)

(72) Inventors: Eiji Toyoda, Ibaraki (JP); Yusaku Shimizu, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 5 days.

(21) Appl. No.: 13/935,444

(22) Filed: Jul. 3, 2013

(65) Prior Publication Data

US 2014/0008821 A1   Jan. 9, 2014

(30) Foreign Application Priority Data

Jul. 5, 2012   (JP) ................. 2012-151557

(51) Int. Cl.
  *H01L 21/56*   (2006.01)
  *H01L 23/29*   (2006.01)
  *H01L 23/00*   (2006.01)
  *H01L 23/31*   (2006.01)

(52) U.S. Cl.
  CPC ............ *H01L 21/56* (2013.01); *H01L 23/29* (2013.01); *H01L 24/19* (2013.01); *H01L 24/96* (2013.01); *H01L 23/3128* (2013.01); *H01L 2924/18162* (2013.01)
  USPC ............................ 257/792; 428/141; 438/114

(58) Field of Classification Search
  CPC ................................ H01L 21/56; H01L 23/29
  USPC ........................ 257/792; 428/141; 438/114
  See application file for complete search history.

(56) References Cited

U.S. PATENT DOCUMENTS

| | | | | |
|---|---|---|---|---|
| 7,335,994 B2 * | 2/2008 | Klein et al. | ................... | 257/778 |
| 2001/0026010 A1 * | 10/2001 | Horiuchi et al. | ............... | 257/678 |
| 2003/0207492 A1 | 11/2003 | Maeda et al. | | |
| 2005/0121761 A1 | 6/2005 | Maeda et al. | | |

FOREIGN PATENT DOCUMENTS

| | | |
|---|---|---|
| JP | 3420748 B2 | 4/2003 |
| JP | 3666576 B | 4/2005 |

* cited by examiner

*Primary Examiner* — Peniel M Gumedzoe
(74) *Attorney, Agent, or Firm* — Alleman Hall McCoy Russell & Tuttle LLP

(57) ABSTRACT

Provided are a sealing resin sheet, wherein a clean, smooth and flat ground surface is obtained by grinding after resin sealing, a method for producing an electronic component package using the same, and an electronic component package obtained by the production method. The present invention provides a sealing resin sheet, wherein a ground surface has a mean surface roughness Ra of 1 μm or less when grinding is performed under conditions of a grind bite peripheral velocity of 1000 m/minute, a feed pitch of 100 μm and a cut depth of 10 μm after a heat curing treatment is performed at 180° C. for 1 hour; and a Shore D hardness at 100° C. after the heat curing treatment is 70 or more.

10 Claims, 4 Drawing Sheets

SEALING RESIN SHEET, METHOD FOR PRODUCING ELECTRONIC COMPONENT PACKAGE AND ELECTRONIC COMPONENT PACKAGE

BACKGROUND OF THE INVENTION

1. Field of the Invention

The present invention relates to a sealing resin sheet, a method for producing an electronic component package and an electronic component package.

2. Description of the Related Art

In recent years, downsizing, weight reduction and function enhancement of electronic instruments have been increasingly required, and accordingly downsizing, thickness reduction and high density mounting have been desired for packages that form electronic instruments.

For preparation of an electronic component package, typically a procedure is employed in which electronic components that are fixed to a substrate, a temporary fixing material or the like are sealed with a sealing resin, and the sealed product is diced as necessary so that a package is formed per each electronic component. For meeting the above-described requirement, in the course of this process, a technique of reducing the thickness by grinding (back-grinding) a sealed product after resin sealing has been proposed (for example Japanese Patent No. 3420748, Japanese Patent No. 3666576, etc.). The thickness reduction by grinding as described above is also an important factor in production processes of thin semiconductor packages such as a flip chip BGA (Ball Grid Array), a flip chip SiP, a fan-in wafer level package and a fan-out wafer level package.

However, when a sealed product is ground, a sealing resin may be dragged by a grinding member such as a grindstone to generate thread-like grind wastes, or quality degradation of a ground surface by deposition of grind wastes on a semiconductor chip and a bump surface or the like, or damage to the grinding member, or the like may occur. It is required not only to merely perform grinding but also to make the ground surface smooth and flat. This is because if an unevenness of the ground surface is too large, precise mounting of electronic components becomes difficult, or cracking or the like of a sealed body occurs due to the unevenness during heat treatment in a subsequent step. Since problems associated with grinding as described above, and smoothing and flattening are not recognized in Japanese Patent No. 3420748 and Japanese Patent No. 3666576, specific solutions are desired.

SUMMARY OF THE INVENTION

An object of the present invention is to provide a sealing resin sheet, wherein a clean, smooth and flat ground surface is obtained by grinding after resin sealing, a method for producing an electronic component package using the sealing resin sheet, and an electronic component package obtained by the production method.

The present inventors have conducted intensive studies, and resultantly found that the problems described above can be solved by employing a specific sealing resin sheet, thus arriving at the present invention.

That is, in a sealing resin sheet of the present invention, a ground surface has a mean surface roughness Ra of 1 µm or less when grinding is performed under conditions of a grind bite peripheral velocity of 1000 m/minute, a feed pitch of 100 µm and a cut depth of 10 µm after a heat curing treatment is performed at 180° C. for 1 hour; and a Shore D hardness at 100° C. after the heat curing treatment is 70 or more.

In the sealing resin sheet, the mean surface roughness Ra is 1 µm or less when grinding is performed under predetermined conditions after the heat curing treatment, and therefore a smooth and flat ground surface can be obtained when an electronic component is sealed using the sealing resin sheet, followed by grinding the obtained sealed body. Consequently, precise mounting of electronic components that are increasingly downsized becomes possible, and occurrence of cracking during heat treatment of a ground product, or the like, can be prevented. If the mean surface roughness Ra is more than 1 µm, an unevenness of the ground surface becomes so large that a height difference occurs in an electrode formed on the surface of an electronic component, an electrode that is formed in a subsequent step, or the like, leading to a reduction in adhesion with electrodes or the like of a substrate, so that precise mounting can no longer be achieved, and cracking easily occurs during heat treatment of a ground product, or the like, so that the reliability of an electronic component package is deteriorated.

In the sealing resin sheet, the Shore D hardness at 100° C. after the heat curing treatment is 70 or more, and therefore even if the ground surface is heated by friction or the like during grinding of a cured product of the sealing resin sheet, grind wastes are merely in the form of extremely fine pieces or powders having some degree of hardness and thus can be easily removed from the ground surface, so that a clean ground surface can be obtained. If the Shore D hardness after the heat curing treatment is less than 70, a constituent resin is softened and thus dragged by a grinding member to generate thread-like grind wastes, which are deposited on the ground surface of the electronic component and the grinding member, causing unexpected staining.

The details of heat curing treatment conditions, grinding conditions and conditions for measurement of the mean surface roughness Ra are as described in the Examples.

In the sealing resin sheet, a Shore D hardness at 25° C. after the heat curing treatment is preferably 70 or more. Consequently, the hardness of grind wastes can be retained during an early period of grinding, and removal of grind wastes is easy over a period of time until a grinding step is completed after being started, so that a clean ground surface can be obtained.

In the sealing resin sheet, a tensile storage modulus at 25° C. after the heat curing treatment is preferably 1 GPa or more. Consequently, in an early period of grinding, a biased ground state can be inhibited as stress on a sealed body from a grinding member is dispersed due to the elasticity of the sealed body, so that the ground surface can be made flat efficiently.

In the sealing resin sheet, a tensile storage modulus at 100° C. after the heat curing treatment is preferably 0.5 GPa or more. Consequently, even if the ground surface is brought into a heated state by grinding, a biased ground state can be inhibited as stress on a sealed body from a grinding member is dispersed due to the elasticity of the sealed body, so that the ground surface can be made flat efficiently over a period of time until grinding is completed after being started.

In the sealing resin sheet, a glass transition temperature after the heat curing treatment is preferably 100° C. or higher. When the sealing resin sheet has this configuration, softening of the sealing resin sheet in the grinding step can be suppressed, so that a high-quality ground surface can be obtained.

The present invention also includes a method for producing an electronic component package, the method including:

a sealing step of sealing an electronic component with the sealing resin sheet;

a sealed body forming step of forming a sealed body by heat-curing the sealing resin sheet; and a grinding step of forming a ground body by grinding the surface of the sealed body so that a ground surface of the sealing resin sheet after grinding of the sealed body has a mean surface roughness Ra of 1 μm or less.

According to the production method of the present invention, the surface of a sealed body obtained using the sealing resin sheet is ground so that the means surface roughness Ra after grinding is 1 μm or less, and therefore an electronic component package having a smooth, flat and clean ground surface can be efficiently produced.

The production method may further include a dicing step of forming an electronic module by dicing the ground body.

In the production method, the electronic component may be a semiconductor chip, or may be a semiconductor wafer. In either cases, an electronic component package having a smooth, flat and clean ground surface can be efficiently produced.

The present invention also includes electronic component packages such as a sealed body with one or more electronic components being resin-sealed, which is obtained by the method for producing an electronic component package, and an electronic component module obtained through resin sealing of an electronic component, and grinding and dicing thereof.

DETAILED DESCRIPTION OF THE PREFERRED EMBODIMENTS

First Embodiment

Sealing Resin Sheet

Figure 1:
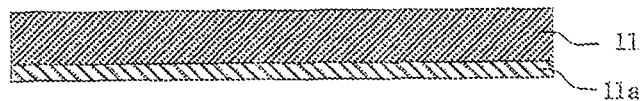
FIG. 1 is a sectional view schematically showing a sealing resin sheet according to one embodiment of the present invention.

A sealing resin sheet according to this embodiment will be described with reference to FIG. 1. FIG. 1 is a sectional view schematically showing a sealing resin sheet according to one embodiment of the present invention. A sealing resin sheet 11 is typically provided in a state of being laminated on a support 11a such as a polyethylene terephthalate (PET) film. The support 11a may be subjected to a mold release treatment for easily peeling off the sealing resin sheet 11.

In the sealing resin sheet 11, a ground surface has a mean surface roughness Ra of 1 μm or less when grinding is performed under conditions including a grind bite peripheral velocity of 1000 m/minute, a feed pitch of 100 μm and a cut depth of 10 μm after a heat curing treatment is performed at 180° C. for 1 hour; and a Shore D hardness at 100° C. after the heat curing treatment is 70 or more. The ground surface preferably has a mean surface roughness Ra of 0.5 μm or less, more preferably 0.3 μm or less. The lower limit of the mean surface roughness Ra of the ground surface is not particularly limited, but is preferably 0.005 μm or more, more preferably 0.01 μm or more, from the viewpoint of securing adhesion with a wiring layer. The Shore D hardness at 100° C. after the heat curing treatment is preferably 75 or more, more preferably 80 or more. The upper limit of the Shore D hardness at 100° C. after the heat curing treatment is not particularly limited, but is preferably 120 or less, more preferably 90 or less, from the viewpoint of reduction of the warp of the sealing resin sheet.

In the sealing resin sheet, the mean surface roughness Ra is 1 μm or less when grinding is performed under predetermined conditions after the heat curing treatment, and therefore a smooth and flat ground surface can be obtained when an electronic component is sealed using the sealing resin sheet, followed by grinding the obtained sealed body. Consequently, precise mounting of electronic components that are increasingly downsized becomes possible, and occurrence of cracking during heat treatment of a ground product, or the like, can be prevented. If the mean surface roughness Ra is more than 1 μm, an unevenness of the ground surface becomes so large that a height difference occurs in an electrode formed on the surface of an electronic component, an electrode that is formed in a subsequent step, or the like, leading to a reduction in adhesion with an electrode or the like of a substrate, so that precise mounting can no longer be achieved, and cracking easily occurs during heat treatment of a ground product, or the like, so that the reliability of an electronic component package is deteriorated.

In the sealing resin sheet, the Shore D hardness at 100° C. after the heat curing treatment is 70 or more, and therefore even if the ground surface is heated by friction or the like during grinding of a cured product of the sealing resin sheet, grind wastes are merely in the form of extremely fine pieces or powders having some degree of hardness and thus can be easily removed from the ground surface, so that a clean ground surface can be obtained. If the Shore D hardness after the heat curing treatment is less than 70, a constituent resin is softened and thus dragged by a grinding member to generate thread-like grind wastes, which are deposited on the ground surface and the grinding member, causing unexpected staining.

In the sealing resin sheet, a Shore D hardness at 25° C. after the heat curing treatment is preferably 70 or more, more preferably or more, further preferably 90 or more. By employing the above-mentioned Shore D hardness after the heat curing treatment, the hardness of grind wastes can be retained during an early period of grinding, and removal of grind wastes is easy over a period of time until a grinding step is completed after being started, so that a clean ground surface can be obtained. On the other hand, the upper limit of the Shore D hardness at 25° C. after the heat curing treatment is not particularly limited, but is preferably 130 or less, more preferably 100 or less, from the viewpoint of reduction of a warp at ordinary temperature.

In the sealing resin sheet, a tensile storage modulus at 25° C. after the heat curing treatment is preferably 1 GPa or more, more preferably 2 GPa or more, further preferably 4 GPa or more. Consequently, in an early period of grinding, a biased ground state can be inhibited as stress on a sealed body from a grinding member is dispersed due to the elasticity of the sealed body, so that the ground surface can be made flat efficiently. The upper limit of the tensile storage modulus at 25° C. after the heat curing treatment is not particularly limited, but is preferably 30 GPa or less, more preferably 15 GPa or less, from the viewpoint of reduction of a warp at ordinary temperature.

In the sealing resin sheet, a tensile storage modulus at 100° C. after the heat curing treatment is preferably 0.5 GPa or more, more preferably 1 GPa or more, further preferably 2 GPa or more. Consequently, even if the ground surface is brought into a heated state by grinding, a biased ground state can be inhibited as stress on a sealed body from a grinding member is dispersed due to the elasticity of the sealed body, so that the ground surface can be made flat efficiently over a period of time until grinding is completed after being started. The upper limit of the tensile storage modulus at 100° C. after the heat curing treatment is preferably 25 GPa or less, more preferably 10 GPa or less, from the viewpoint of reduction of a warp.

In the sealing resin sheet, a glass transition temperature after the heat curing treatment is preferably 100° C. or higher, more preferably 110° C. or higher, further preferably 120° C. or higher. When the sealing resin sheet has this configuration, softening of the sealing resin sheet in the grinding step can be suppressed, so that a high-quality ground surface can be obtained. On the contrary, the upper limit of the glass transition temperature after the heat curing treatment is not particularly limited, but is preferably 200° C. or lower, more preferably 170° C. or lower, from the viewpoint of reduction of shrinkage on curing at the time of heat curing.

A resin composition that forms the sealing resin sheet is not particularly limited as long as it has characteristics described above, and can be used for resin-sealing of an electronic component such as a semiconductor chip, but examples of the preferred resin composition include epoxy resin compositions containing components A to E shown below. The component C may or may not be added as required.

Component A: epoxy resin
Component B: phenol resin
Component C: elastomer
Component D: organic filler
Component E: curing accelerator (Component A)

The epoxy resin (component A) is not particularly limited. Various kinds of epoxy resins can be used such as, for example, a triphenylmethane-type epoxy resin, a cresol novolac-type epoxy resin, a biphenyl-type epoxy resin, a modified bisphenol A-type epoxy resin, a bisphenol A-type epoxy resin, a bisphenol F-type epoxy resin, a modified bisphenol F-type epoxy resin, dicyclopentadiene-type epoxy resin, a phenol novolac-type epoxy resin and a phenoxy resin. These epoxy resins may be used alone or in combination of two or more thereof.

An epoxy resin which has an epoxy equivalent of 150 to 250 and a softening point or melting point of 50 to 130° C. and is solid at ordinary temperature is preferred from the viewpoint of securing toughness after curing of the epoxy resin and reactivity of the epoxy resin, and particularly a triphenylmethane-type epoxy resin, a cresol novolac-type epoxy resin and a biphenyl-type epoxy resin are preferred from the viewpoint of reliability.

A modified bisphenol A-type epoxy resin having a flexible backbone of an acetal group, a polyoxyalkylene group or the like is preferred from the viewpoint of low stress, and a modified bisphenol A-type epoxy resin having an acetal group can be especially suitably used because it is liquid and has good handling characteristics.

The content of the epoxy resin (component A) is preferably set in a range of 1 to 10% by weight based on the total amount of the epoxy resin composition.

(Component B)

The phenol resin (component B) is not particularly limited as long as it causes a curing reaction with the epoxy resin (component A). For example, a phenol novolac resin, a phenol aralkyl resin, a biphenyl aralkyl resin, a dicyclopentadiene-type phenol resin, a cresol novolac resin, a resol resin and the like are used. These phenol resins may be used alone or in combination of two or more thereof.

As the phenol resin, a phenol resin having a hydroxyl equivalent of 70 to 250 and a softening point of 50 to 110° C. is preferably used from the viewpoint of reactivity with the epoxy resin (component A), and particularly a phenol novolac resin can be suitably used because of its high curing reactivity. A phenol resin having low hygroscopicity, such as a phenol aralkyl resin and a biphenyl aralkyl resin, can also be suitably used from the viewpoint of reliability.

The epoxy resin (component A) and the phenol resin (component B) are blended in such a ratio that the total amount of hydroxyl groups in the phenol resin (component B) is preferably 0.7 to 1.5 equivalents, more preferably 0.9 to 1.2 equivalents, based on 1 equivalent of epoxy groups in the epoxy resin (component A) from the viewpoint of curing reactivity.

(Component C)

The elastomer (component C) that is used together with the epoxy resin (component A) and the phenol resin (component B) imparts, to the epoxy resin composition, flexibility required for sealing an electronic component with the sealing resin sheet, and the structure of the elastomer is not particularly limited as long as such an effect is exhibited. For example, various kinds of acryl-based copolymers such as a polyacrylic acid ester, styrene acrylate-based copolymers, rubber polymers such as butadiene rubber, styrene-butadiene rubber (SBR), ethylene-vinyl acetate copolymer (EVA), isoprene rubber and acrylonitrile rubber can be used. Particularly, an acryl-based copolymer is preferably used because it is easily dispersed in the epoxy resin (component A) and has high reactivity with the epoxy resin (A component), so that the heat resistance and strength of the sealing resin sheet obtained can be improved. They may be used alone or in combination of two or more thereof.

The acryl-based copolymer can be synthesized by, for example, radical-polymerizing an acrylic monomer mixture prepared at a predetermined mixing ratio using a usual method. As a method for radical polymerization, a solution polymerization method using an organic solvent as a solvent, or suspension polymerization method of performing polymerization while dispersing a raw material monomer in water is used. Examples of the polymerization initiator used at this time include 2,2'-azobisisobutyronitrile, 2,2'-azobis-(2,4-dimethylvaleronitrile), 2,2'-azobis-4-methoxy-2,4-dimethylvaleronitrile and other azo-based or diazo-based polymerization initiators, and peroxide-based polymerization initiators such as benzoyl peroxide and methyl ethyl ketone peroxide. In the case of suspension polymerization, it is desirable to use a dispersant such as, for example, polyacrylamide or polyvinyl alcohol.

The content of the elastomer (component C) is 15 to 30% by weight based on the total amount of the epoxy resin composition. If the content of the elastomer (component C) is less than 15% by weight, it becomes difficult to secure the plasticity and flexibility of the sealing resin sheet 11, and further it becomes difficult to perform resin sealing while suppressing the warp of the sealing resin sheet. If conversely the above-described content is more than 30% by weight, there is the tendency that the melt viscosity of the sealing resin sheet 11 is increased to deteriorate the embedding characteristic of an electronic component, and the strength and heat resistance of a cured body of the sealing resin sheet 11 are reduced.

The weight ratio of the elastomer (component C) to the epoxy resin (component A) (weight of component C/weight of component A) is preferably set in a range of 3 to 4.7. This is because if the weight ratio is less than 3, it becomes difficult to control the fluidity of the sealing resin sheet 11, and if the weight ratio is more than 4.7, there is the tendency that the tackiness of the sealing resin sheet 11 to an electronic component is deteriorated.

(Component D)

The inorganic filler (component D) is not particularly limited, various kinds of previously known fillers can be used, and examples thereof include powders of quartz glass, talc, silica (fused silica, crystalline silica, etc.), alumina, aluminum nitride, silicon nitride and boron nitride. They may be used alone or in combination of two or more thereof.

Particularly, silica powders are preferably used because the thermal linear expansion coefficient of a cured body of the epoxy resin composition is reduced to thereby reduce internal stress, and resultantly the warp of the sealing resin sheet 11 after sealing of an electronic component can be suppressed, and among silica powders, a fused silica powder is more preferably used. Examples of the fused silica powder include a spherical fused silica powder and a crushed fused silica powder, but a spherical fused silica powder is especially preferably used from the viewpoint of fluidity. Particularly, those having an average particle diameter ranging from 0.1 to 30 µm are preferably used, and those having an average particle diameter ranging from 0.3 to 15 µm are especially preferably used.

The average particle diameter can be derived by making a measurement with a laser diffraction scattering grain size distribution measuring device using a sample that is randomly extracted from a population.

The content of the inorganic filler (component D) is preferably 70 to 95% by weight, more preferably 75 to 92% by weight, further preferably 80 to 90% by weight based on the total amount of the epoxy resin composition. If the content of the inorganic filler (component D) is less than 50% by weight, there is the tendency that the warp of the sealing resin sheet 11 is increased because the linear expansion coefficient of a cured body of the epoxy resin composition is increased. On the other hand, if the above-described content is more than 90% by weight, there is the tendency that tackiness with an electronic component is reduced because the plasticity and fluidity of the sealing resin sheet 11 are deteriorated.

(Component E)

The curing accelerator (component E) is not particularly limited as long as it causes curing of the epoxy resin and the phenol resin to proceed, but organic phosphorus-based compounds such as triphenylphosphine and tetraphenylphosphonium tetraphenylborate, and imidazole-based compounds are suitably used from the viewpoint of curability and keeping quality. These curing accelerators may be used alone or in combination with other curing accelerators.

The content of the curing accelerator (component E) is preferably 0.1 to 5 parts by weight based on 100 parts by weight of the total of the epoxy resin (component A) and the phenol resin (component B).

(Other Components)

To the epoxy resin composition may be added a flame retardant component in addition to the components A to E. As the flame retardant component, various kinds of metal hydroxides such as, for example, aluminum hydroxide, magnesium hydroxide, iron hydroxide, calcium hydroxide, tin hydroxide and conjugated metal hydroxides can be used.

The average particle diameter of the metal hydroxide is preferably 1 to 10 µm, further preferably 2 to 5 µm from the viewpoint of securing appropriate fluidity when the epoxy resin composition is heated. If the average particle diameter of the metal hydroxide is less than 1 µm, it becomes difficult to uniformly disperse the metal hydroxide in the epoxy resin composition, and sufficient fluidity may not be achieved during heating of the epoxy resin composition. If the average particle diameter is more than 10 µm, there is the tendency that the flame retardant effect is reduced because the surface area per added amount of the metal hydroxide (component E) is decreased.

As the flame retardant component, not only the above-mentioned metal hydroxides but also a phosphazene compound can be used. As the phosphazene compound, for example, SPR-100, SA-100 and SP-100 (each manufactured by Otsuka Chemical Co., Ltd.), FP-100 and FP-110 (each manufactured by FUSHIMI Pharmaceutical Co., Ltd.) and the like are available as commercial products.

A phosphazene compound represented by the formula (1) or (2) is preferred because it exhibits a flame retardant effect even in a small amount, and the content of phosphorus elements contained in the phosphazene compound is preferably 12% by weight or more.

[Formula 1]

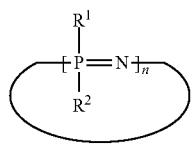

(1)

(wherein, n is an integer of 3 to 25, $R^1$ and $R^2$ are the same or different, and are each a monovalent organic group having a functional group selected from the group consisting of an alkoxy group, a phenoxy group, an amino group, a hydroxyl group and an allyl group.)

[Formula 2]

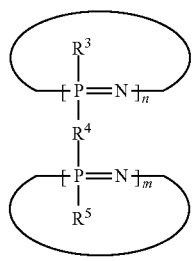

(2)

(wherein, n and m are each independently an integer of 3 to 25. $R^3$ and $R^5$ are the same or different, and are each a monovalent organic group having a functional group selected from the group consisting of an alkoxy group, a phenoxy group, an amino group, a hydroxyl group and an allyl group. $R^4$ is a divalent organic group having a functional group selected from the group consisting of an alkoxy group, a phenoxy group, an amino group, a hydroxyl group and an allyl group.)

A cyclic phosphazene oligomer represented by the formula (3) is preferably used from the viewpoint of stability and suppression of generation of voids.

[Formula 3]

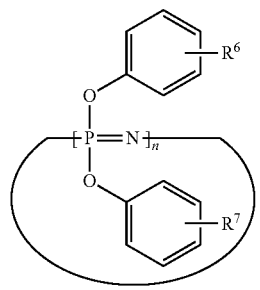

(3)

(wherein, n is an integer of 3 to 25, and $R^6$ and $R^7$ are the same or different, and are each hydrogen, a hydroxyl group, an alkyl group, an alkoxy group or a glycidyl group.)

As the cyclic phosphazene oligomer represented by the above formula (3), for example, FP-100 and FP-110 (each manufactured by FUSHIMI Pharmaceutical Co., Ltd.) and the like are available as commercial products.

The content of the phosphazene compound is preferably 10 to 30% by weight based on the total amount of organic components including the epoxy resin (component A), the phenol resin (component B) and the elastomer (component D) and the curing accelerator (component E) and the phosphazene compound (other components) which are contained in the epoxy resin composition. That is, if the content of the phosphazene compound is less than 10% by weight based on the total amount of the organic components, there is the tendency that the flame retardancy of the sealing resin sheet 11 is deteriorated, and followability to the unevenness of an adherend (e.g., a substrate on which an electronic component is mounted) is deteriorated, leading to generation of voids. If the content is more than 30% by weight of the total amount of the organic components, there is the tendency that tackiness causing sticking easily occurs on the surface of the sealing resin sheet 11, so that workability is deteriorated, e.g., it becomes difficult to perform positioning to an adherend.

The above-mentioned metal hydroxide and phosphazene compound can also be used in combination to obtain the sealing resin sheet 11 which is excellent in flame retardancy while retaining flexibility required for sheet sealing. By using the metal hydroxide and the phosphazene compound in combination, sufficient flame retardancy when only the metal hydroxide is used and sufficient flexibility when only the phosphazene compound is used can be obtained.

Among the above-described flame retardants, it is desirable to use an organic flame retardant from the viewpoint of deformability of a sealing resin sheet during molding of resin-sealing, followability to the unevenness of an electronic component and an adherend, and adhesion to the electronic component and the adherend, and particularly a phosphazene-based flame retardant is suitably used.

The epoxy resin composition may appropriately contain other additives such as pigments including carbon black as necessary in addition to the components described above.

(Method for Preparation of Sealing Resin Sheet)

A method for preparation of a sealing resin sheet will be described below. First, en epoxy resin composition is prepared by mixing the components described above. The mixing method is not particularly limited as long as the components are uniformly dispersed and mixed. Thereafter, for example, a varnish prepared by dissolving or dispersing the components in an organic solvent or the like is applied and formed into a sheet. Alternatively, a kneaded product may be prepared by kneading the blend components directly with a kneader or the like, and extruded to be formed into a sheet.

As a specific preparation procedure using a varnish, the components A to E and other additives as necessary are appropriately mixed in accordance with a usual method, and the mixture is uniformly dissolved or dispersed in an organic solvent to prepare a varnish. Then, the varnish is applied onto a support of polyester or the like, and dried, whereby the sealing resin sheet 11 can be obtained. A release sheet such as a polyester film may be laminated as necessary for protecting the surface of the sealing resin sheet. The release sheet is peeled off at the time of sealing.

The organic solvent is not particularly limited, and various kinds of previously known organic solvents, for example, methyl ethyl ketone, acetone, cyclohexanone, dioxane, diethyl ketone, toluene, ethyl acetate and the like can be used. They may be used alone or in combination of two or more thereof. Normally, it is preferred to use the organic solvent in such a manner that the solid concentration of the varnish ranges from 30 to 60% by weight.

The thickness of the sheet after drying of the organic solvent is not particularly limited, but is normally set to preferably 5 to 100 μm, more preferably 20 to 70 μm, from the viewpoint of uniformity of the thickness and the amount of a residual solvent.

On the other hand, when kneading is used, components including the components A to E and other additives as necessary are mixed using known means such as a mixer, and the mixture is then melt-kneaded to prepare a kneaded product. The method for performing melt-kneading is not particularly limited, and examples thereof include methods of performing melt-kneading by a known kneader such as a mixing roll, a pressure kneader or an extruder. Kneading conditions are not particularly limited as long as the temperature is equal to or higher than the softening points of the components described above, and the temperature is, for example, 30 to 150° C., and preferably 40 to 140° C., further preferably 60 to 120° C. when considering the heat-curability of the epoxy resin, and the time is, for example, 1 to 30 minutes, preferably 5 to 15 minutes. In this way, a kneaded product can be prepared.

Through molding the resulting kneaded product by extrusion molding, the sealing resin sheet 11 can be obtained. Specifically, the kneaded product after melt-kneading is extrusion-molded while it is kept at a high temperature without being cooled, whereby the sealing resin sheet 11 can be formed. The extrusion method for this purpose is not particularly limited, and examples thereof include a T die extrusion method, a rolling method, a roll kneading method, a co-extrusion method and a calender molding method. The extrusion temperature is not particularly limited as long as it is equal to or higher than the softening points of the components described above, but the extrusion temperature is, for example, 40 to 150° C., preferably 50 to 140° C., further preferably 70 to 120° C. when considering the heat curability and moldability of the epoxy resin. In this way, the sealing resin sheet 11 can be formed.

The sealing resin sheet thus obtained may be laminated as necessary so as to have a desired thickness, and used. In other words, the sealing resin sheet may be used in the form of a monolayer structure, or may be used as a laminate formed by laminating the sealing resin sheet into a multilayer structure having two or more layers.

[Method for Producing Electronic Component Package]

Next, a method for producing an electronic component package according to this embodiment, which uses the sealing resin sheet described above, will be described with reference to FIGS. 2A to 2E. FIGS. 2A to 2E are sectional views each schematically showing one step of a method for producing an electronic component package according to one embodiment of the present invention. In a first embodiment, semiconductor chips mounted on a substrate are resin-sealed with a sealing resin sheet to prepare an electronic component package. In this embodiment, semiconductor chips are used as an electronic component, and a printed wiring substrate is used as an adherend, but elements other than those mentioned above may be used. For example, a capacitor, a sensor device, a light emitting element, a vibration element or the like can be used as the electronic component, and a lead frame, a tape carrier or the like can be used as the adherend. Alternatively, the electronic component may be temporarily fixed on a temporary fixing material, and then resin-sealed without using the adherend. Regardless of which of the elements is used, a high level of protection of the electronic component by resin sealing can be achieved. The method for producing an electronic component package according to the first embodiment is suitable for production of a flip chip-type mounted substrate.

(Semiconductor Chip Mounting Substrate Providing Step)

Figure 2A:
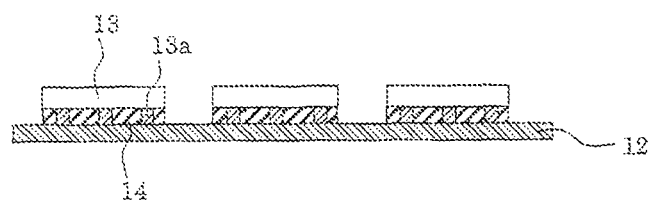
FIG. 2A is a sectional view schematically showing one step of a method for producing an electronic component package according to one embodiment of the present invention.

In a semiconductor chip mounting substrate providing step, a printed wiring substrate 12 on which a plurality of semiconductor chips 13 are mounted is provided (see FIG. 2A). The semiconductor chips 13 can be formed by dicing a semiconductor wafer, on which a predetermined circuit is formed, into individual pieces by a known method. For mounting the semiconductor chips 13 onto the printed wiring substrate 12, a known device such as a flip chip bonder or a die bonder can be used. The semiconductor chip 13 and the printed wiring substrate 12 are electrically connected via a projecting electrode 13a such as a bump. An under-fill material 14 is filled between the semiconductor chip 13 and the printed wiring substrate 12 for lessening a difference in thermal expansion coefficient between the former and the latter to prevent occurrence of cracking particularly at a connection site. As the under-fill material 14, one that is known may be used. Arrangement of the under-fill material 14 may be performed by injecting a liquid under-fill material 14 between the semiconductor chip 13 and the printed wiring substrate 12 after mounting the former on the latter, or performed by providing the semiconductor chip 13 or printed wiring substrate 12 with a sheet-shaped under-fill material 14, and then connecting the semiconductor chip 13 and the printed wiring substrate 12.

(Sealing Step)

Figure 2B:
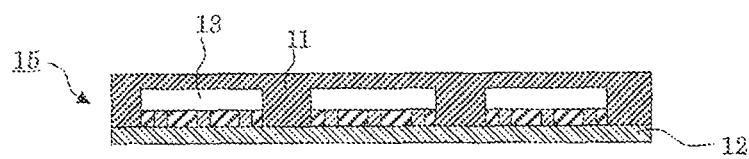
FIG. 2B is a sectional view schematically showing one step of a method for producing an electronic component package according to one embodiment of the present invention.

In a sealing step, the sealing resin sheet 11 is laminated to the printed wiring substrate 12 so as to cover the semiconductor chips 13, and the semiconductor chips 13 are resin-sealed with the sealing resin sheet (see FIG. 2B).

The sealing resin sheet 11 serves as a sealing resin for protecting the semiconductor chips 13 and elements associated therewith from the external environment.

The method for laminating the sealing resin sheet 11 is not particularly limited, and examples thereof include a method in which a melt-kneaded product of a resin composition for forming a sealing resin sheet is extrusion-molded, and the extrusion-molded product is placed on the printed wiring substrate 12 and pressed to perform formation and lamination of the sealing resin sheet 11 at once, and a method in which a resin composition for forming the sealing resin sheet 11 is applied onto a mold release treatment sheet, the coated film is dried to form the sealing resin sheet 11, and then the sealing resin sheet 11 is transferred onto the printed wiring substrate 12.

In this embodiment, by employing the sealing resin sheet 11, the semiconductor chips 13 can be embedded and covered merely by bonding the sealing resin sheet 11 onto the printed wiring substrate 12, so that the production efficiency of the semiconductor package can be improved. In this case, the sealing resin sheet 11 can be laminated on the printed wiring substrate 12 by a known method such as heat pressing or a laminator. For heat pressing conditions, the temperature is, for example, 40 to 120° C., preferably 50 to 100° C., the pressure is, for example, 50 to 2500 kPa, preferably 100 to 2000 kPa, and the time is, for example, 0.3 to 10 minutes, preferably 0.5 to 5 minutes. When considering the adhesion and followability of the sealing resin sheet 11 to the semiconductor chips 13 and the printed wiring substrate 12, it is preferred to perform pressing preferably under a reduced pressure condition (e.g., 10 to 2000 Pa).

(Sealed Body Forming Step)

In a sealed body forming step, the sealing resin sheet is subjected to a heat curing treatment to form a sealed body 15

(see FIG. 2B). Regarding conditions for the heat curing treatment of the sealing resin sheet, the heating temperature is preferably 100° C. to 200° C., more preferably 120° C. to 180° C., the heating time is preferably 10 minutes to 180 minutes, more preferably 30 minutes to 120 minutes, and a pressure may be applied as necessary. When a pressure is applied, a pressure of preferably 0.1 MPa to 10 MPa, more preferably 0.5 MPa to 5 MPa can be employed.

(Grinding Step)

Figure 2C:
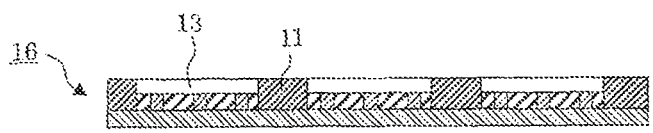
FIG. 2C is a sectional view schematically showing one step of a method for producing an electronic component package according to one embodiment of the present invention.

In a grinding step, a ground body 16 is formed by grinding the surface of the sealed body 15 so that a ground surface of the sealing resin sheet after grinding of the sealed body 15 has a mean surface roughness Ra of 1 μm or less (see FIG. 2C). At the time of grinding, the semiconductor chips 13 may be ground together with the sealing resin sheet 11 as shown in FIG. 2C, or only the sealing resin sheet 11 may be ground. The grinding may be performed using a known grinder. A procedure can be suitably employed in which while rotating a grinding bite such as a diamond bite, the sealed body 15 is fed thereto to grind the surface of the sealed body, so that the ground body 16 having a predetermined thickness and mean surface roughness Ra is formed. In this embodiment, a predetermined sealing resin sheet is used, and therefore a ground surface having a mean surface roughness Ra of 1 μm or less after grinding can be efficiently achieved.

(Bump Forming Step)

Figure 2D:
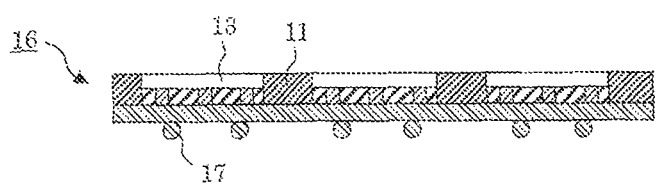
FIG. 2D is a sectional view schematically showing one step of a method for producing an electronic component package according to one embodiment of the present invention.

Then, bumping processing may be performed for forming bumps 17 on a surface on the side opposite to the semiconductor chip mounting surface of the printed wiring substrate 12 (see FIG. 2D). Bumping processing can be performed by a known method such as a solder ball or solder plating. The material of the bump is not particularly limited, and examples thereof include solders (alloys) such as a tin-lead-based metal material, a tin-silver-based metal material, a tin-silver-copper-based metal material, a tin-zinc-based metal material, and a tin-zinc-bismuth-based metal material; a gold-based metal material and a copper-based metal material.

(Dicing Step)

Figure 2E:
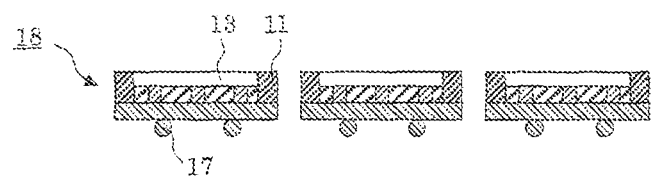
FIG. 2E is a sectional view schematically showing one step of a method for producing an electronic component package according to one embodiment of the present invention.

Subsequently, dicing of the ground body 16 including elements such as the sealing resin sheet 11, the printed wiring substrate 12 and the semiconductor chips 13 may be performed (see FIG. 2E). Consequently, an electronic module 18 can be obtained for each semiconductor chip 13. The dicing is normally performed after the ground body 16 is fixed by a previously known dicing sheet. The positioning of cut areas may be performed by image recognition using direct illumination or indirect illumination.

In this step, for example, a cutting method called full cut, in which cutting is made to a dicing sheet, can be employed. The dicing device used in this step is not particularly limited, and one that is previously known can be used.

When expanding of the ground body is performed subsequently to the dicing step, the expanding can be carried out using a previously known expanding device. The expanding device has a doughnut-like outer ring capable of depressing the dicing sheet downward via a dicing ring, and an inner ring having a diameter smaller than that of the outer ring and supporting the dicing sheet. Owing to this expanding step, a situation can be prevented in which adjacent electronic modules 18 come into contact with each other and are thus broken.

(Substrate Mounting Process)

A substrate mounting process of mounting (not shown) the electronic module 18 obtained as described above on another substrate can be performed as necessary. For mounting the electronic module 18 on the substrate, a known device such as a flip chip bonder or a die bonder can be used.

Second Embodiment

Next, a second embodiment of the present invention will be described. In the first embodiment, a production method suitable for production of a flip chip-type mounting substrate has been described, but in the second embodiment, a production method suitable for production of an electronic component package referred to as a Fan-in-type wafer level package (WLP) is described. FIGS. 3A to 3E are sectional views each schematically showing one step of a method for producing an electronic component package according to the second embodiment of the present invention.

(Semiconductor Wafer Providing Step)

A plurality of projecting electrodes 23a may be formed on one surface of a semiconductor wafer 29 (see FIG. 3A), or projecting electrodes may be formed on both surfaces of the semiconductor wafer 29 (not shown). The material of the projecting electrode such as a bump or a conductive material is not particularly limited, and examples thereof include solders (alloys) such as a tin-lead-based metal material, a tin-silver-based metal material, a tin-silver-copper-based metal material, a tin-zinc-based metal material, and a tin-zinc-bismuth-based metal material; a gold-based metal material and a copper-based metal material. The height of the projecting electrode is also determined according to an application, and is generally about 20 to 200 μm.

When projecting electrodes are formed on both surfaces of the semiconductor wafer 29, the projecting electrodes on both surfaces may or may not be electrically connected to each other. Examples of electrical connection between projecting electrodes include connection through a via, which is called a through-silicon-via (TSV) type.

(Sealing Step)

Figure 3A:
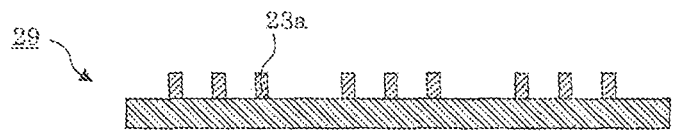
FIG. 3A is a sectional view schematically showing one step of a method for producing an electronic component package according to another embodiment of the present invention.
Figure 3B:
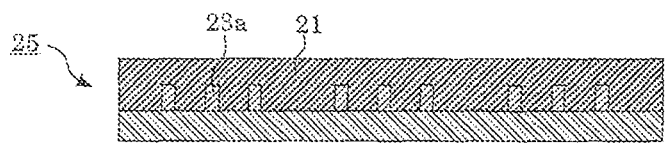
FIG. 3B is a sectional view schematically showing one step of a method for producing an electronic component package according to another embodiment of the present invention.

In a sealing step, a sealing resin sheet 21 is laminated onto the semiconductor wafer 29 so as to cover the projecting electrodes 23a, and one surface of the semiconductor wafer 29 is resin-sealed with the sealing resin sheet (see FIG. 3B). The sealing resin sheet 21 serves as a sealing resin for protecting the semiconductor chips 29 and elements associated therewith from the external environment. Conditions similar to those in the first embodiment can be employed in a method for laminating the sealing resin sheet 21 onto the semiconductor wafer 29.

(Sealed Body Forming Step)

In a sealed body forming step, the sealing resin sheet 21 is subjected to a heat curing treatment to form a sealed body 25 (see FIG. 3B). As conditions for the heat curing treatment of the sealing resin sheet 21, conditions similar to those in the first embodiment can be employed.

(Grinding Step)

Figure 3C:
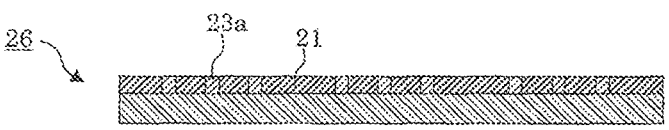
FIG. 3C is a sectional view schematically showing one step of a method for producing an electronic component package according to another embodiment of the present invention.
Figure 3D:
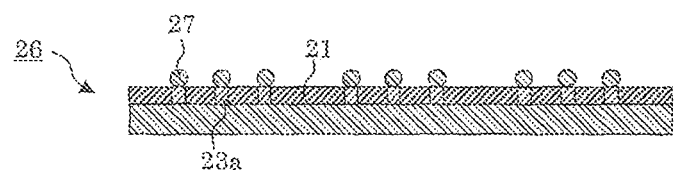
FIG. 3D is a sectional view schematically showing one step of a method for producing an electronic component package according to another embodiment of the present invention.

In a grinding step, a ground body 26 is formed by grinding the surface of the sealed body 25 so that a ground surface of the sealing resin sheet after grinding of the sealed body 25 has a mean surface roughness Ra of 1 μm or less (see FIG. 3C). At the time of grinding, grinding is performed so that the projecting electrodes 23a are exposed as shown in FIG. 3C. The grinding may be performed using a known grinder. In this embodiment, a predetermined sealing resin sheet is used, and therefore a ground surface of the sealing resin sheet 21 after grinding, which has a mean surface roughness Ra of 1 μm or less, can be efficiently achieved.

(Bump Forming Step)

Then, bumping processing is performed for forming bumps 27 on the exposed projecting electrodes 23a (see FIG.

3D). A bumping processing method and a material of the bump similar to those in the first embodiment can be employed.

(Dicing Step)

Figure 3E:
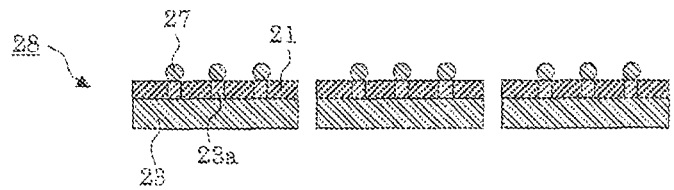
FIG. 3E is a sectional view schematically showing one step of a method for producing an electronic component package according to another embodiment of the present invention.

Subsequently, dicing of the ground body 26 including elements such as the sealing resin sheet 21, the semiconductor wafer 29 and the bumps 27 may be performed (see FIG. 3E). Consequently, an electronic module 28 can be obtained per each semiconductor chip 23. As a dicing method, a method similar to that in the first embodiment can be employed.

(Substrate Mounting Process)

A substrate mounting process of mounting (not shown) the electronic module 28 obtained as described above on another substrate can be performed as necessary. For mounting the electronic module 28 on the substrate, a known device such as a flip chip bonder or a die bonder can be used.

Third Embodiment

A third embodiment of the present invention will be described below. FIGS. 4A to 4G are sectional views each schematically showing one step of a method for producing an electronic component package according to still another embodiment of the present invention. In the first embodiment, semiconductor chips mounted on a printed wiring substrate are resin-sealed with a sealing resin sheet, but in the third embodiment, semiconductor chips are resin-sealed while the semiconductor chips are temporarily fixed on a temporary fixing material rather than an adherend such as a substrate. The third embodiment is suitable for production of an electronic component package referred to as a Fan-out-type wafer level package (WLP).

[Temporary Fixing Material Providing Step]

Figure 4A:
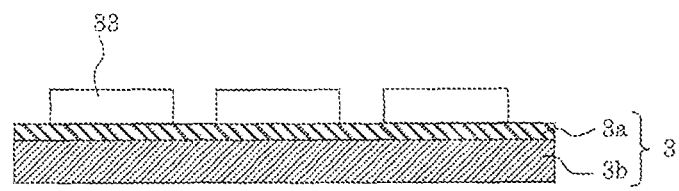
FIG. 4A is a sectional view schematically showing one step of a method for producing an electronic component package according to still another embodiment of the present invention.

In a temporary fixing material providing step, a temporary fixing material 3 in which a thermally expandable pressure-sensitive adhesive layer 3a is laminated on a support 3b is provided (see FIG. 4A). A radiation-curable pressure-sensitive adhesive layer can be used in place of the thermally expandable pressure-sensitive adhesive layer. In this embodiment, the temporary fixing material 3 including the thermally expandable pressure-sensitive adhesive layer is described.

(Thermally Expandable Pressure-Sensitive Adhesive Layer)

The thermally expandable pressure-sensitive adhesive layer 3a can be formed from a pressure-sensitive adhesive composition including a polymer component and a foaming agent. As the polymer component (particularly a base polymer), an acryl-based polymer (referred to as "acrylic polymer A" in some cases) can be suitably used. Examples of the acrylic polymer A include those using a (meth)acrylic acid ester as a main monomer. (Meth)acrylic acid refers to an acrylic acid and/or a methacrylic acid, and hereinafter, every occurrence of (meth) in the present application has the same meaning. Examples of the (meth)acrylic acid ester include (meth)acrylic acid alkyl esters (e.g., linear or branched alkyl esters with an alkyl group having 1 to 30 carbon atoms, particularly 4 to 18 carbon atoms, such as methyl ester, ethyl ester, propyl ester, isopropyl ester, butyl ester, isobutyl ester, sec-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester and eicosyl ester) and (meth)acrylic acid cycloalkyl esters (e.g., cyclopentyl ester and cyclohexyl ester, etc.). These (meth)acrylic acid esters may be used alone or in combination of two or more thereof.

The acrylic polymer A may contain units corresponding to other monomer components that can be copolymerized with the (meth)acrylic acid ester as necessary for the purpose of modifying cohesive strength, heat resistance, cross linkage and the like. Examples of the monomer component include carboxyl group-containing monomers such as acrylic acid, methacrylic acid, itaconic acid, maleic acid, fumaric acid, crotonic acid and carboxyethyl acrylate; acid anhydride group-containing monomers such as maleic anhydride and itaconic anhydride; hydroxyl group-containing monomers such as hydroxyethyl (meth)acrylate, hydroxypropyl (meth)acrylate and hydroxybutyl (meth)acrylate; (N-substituted or unsubstituted) amide-based monomers such (meth)acrylamide, N,N-dimethyl (meth)acrylamide, N-butyl (meth)acrylamide, N-methylol (meth)acrylamide and N-methylolpropane (meth)acrylamide; vinyl ester-based monomers such as vinyl acetate and vinyl propionate; styrene-based monomers such as styrene and α-methylstyrene; vinyl ether-based monomers such as vinyl methyl ether and vinyl ethyl ether; cyano acrylate-based monomers such as acrylonitrile and methacrylonitrile; epoxy group-containing acryl-based monomers such as glycidyl acrylate; olefin or diene-based monomers such as ethylene, propylene, isoprene, butadiene and isobutylene; (substituted or unsubstituted) amino group-containing monomers such as aminoethyl (meth)acrylate, N,N-dimethylaminoethyl (meth)acrylate and t-butylaminoethyl (meth)acrylate; (meth)acrylic acid alkoxyalkyl-based monomers such as methoxyethyl (meth)acrylate and ethoxyethyl (meth)acrylate; monomers having a nitrogen atom-containing ring such as N-vinylpyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine and N-vinylcaprolactam; N-vinylcarboxylic acid amides; sulfonic acid group-containing monomers such as styrenesulfonic acid, allylsulfonic acid, (meth)acrylamidepropanesulfonic acid and sulfopropyl (meth)acrylate; phosphoric acid group-containing monomers such as 2-hydroxyethylacryloyl phosphate; maleimide-based monomers such as N-cyclohexylmaleimide, N-isopropylmaleimide, N-laurylmaleimide and N-phenylmaleimide; itaconimide-based monomers such as N-methylitaconimide, N-ethylitaconimide, N-butylitaconimide, N-octylitaconimide, N2-ethylhexylitaconimide, N-cyclohexylitaconimide and N-laurylitaconimide; succinimide-based monomers such as N-(meth)acryloyloxymethylenesuccinimide, N-(meth)acryloyl-6-oxyhexamethylenesuccinimide and N-(meth)acryloyl-8-oxyoctamethylenesuccinimide; glycol-based acryl ester monomers such as polyethylene glycol (meth)acrylate and polypropylene glycol (meth)acrylate; monomers having an oxygen atom-containing heterocyclic ring such as tetrahydrofurfuryl (meth)acrylate; acrylic acid ester-based monomers containing a fluorine atom such as fluorine-based (meth)acrylates; acrylic acid ester-based monomers containing a silicon atom such as silicone-based (meth)acrylates; and polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy acrylate, polyester acrylate, urethane acrylate, divinylbenzene, butyl di(meth)acrylate and hexyl di(meth)acrylate.

The acrylic polymer A is obtained by subjecting a single monomer or a mixture of two or more monomers to polymerization. The polymerization can be performed by any method such as solution polymerization (e.g., radical polymerization, anionic polymerization, cationic polymerization, etc.), emulsion polymerization, mass polymerization, suspension polymerization or photopolymerization (e.g., ultraviolet polymerization, etc.).

A weight average molecular weight of the acrylic polymer A is not particularly limited, but is preferably 350000 to 1000000, further preferably about 450000 to 800000.

For the thermally expandable pressure-sensitive adhesive, an external crosslinker can also be appropriately used for adjusting adhesive strength. Specific examples of the external crosslinking method include a method in which a so called crosslinker such as a polyisocyanate compound, an epoxy compound, an aziridine or a melamine-based crosslinker is added and reacted. When the external crosslinker is used, the amount thereof used is appropriately determined according to a balance with a base polymer to be crosslinked, and a use purpose as a pressure-sensitive adhesive. The amount of the external crosslinker used is generally 20 parts by weight or less (preferably 0.1 part by weight to 10 parts by weight) based on 100 parts by weight of the base polymer.

The thermally expandable pressure-sensitive adhesive layer $3a$ contains a foaming agent for imparting thermal expandability as described above. Accordingly, in a state in which a ground body 36 containing ground semiconductor chips 33 are formed on the thermally expandable pressure-sensitive adhesive layer $3a$ of the temporary fixing material 3 (see FIG. 4D), the temporary fixing material 3 is at least partially heated at any given time to foam and/or expand a foaming agent contained in the heated part of the thermally expandable pressure-sensitive adhesive layer $3a$, whereby the thermally expandable pressure-sensitive adhesive layer $3a$ is at least partially expanded. Due to the at least partial expansion of the thermally expandable pressure-sensitive adhesive layer $3a$, a pressure-sensitive adhesive surface (interface with ground body 36) corresponding to the expanded part is deformed into an uneven shape, so that the bonding surface between the thermally expandable pressure-sensitive adhesive layer $3a$ and the ground body 36 is decreased. Consequently adhering strength between the former and the latter is reduced, and thus the ground body 36 can be peeled off from the temporary fixing material 3.

(Foaming Agent)

The foaming agent used in the thermally expandable pressure-sensitive adhesive layer $3a$ is not particularly limited, and can be appropriately selected from known foaming agents. The foaming agent may be used alone or in combination of two or more foaming agents. As the foaming agent, thermally expandable microspheres can be suitably used.

(Thermally Expandable Microspheres)

The thermally expandable microspheres are not particularly limited, and can be appropriately selected from known thermally expandable microspheres (such as various inorganic thermally expandable microspheres and organic thermally expandable microspheres). As the thermally expandable microspheres, a microencapsulated foaming agent can be suitably used because of the easy mixing operation or the like. Examples of the thermally expandable microspheres include microspheres in which a substance that is easily gasified to expand when heated, such as isobutane, propane or pentane is included in a shell having elasticity. The shell is often formed of a thermally meltable substance or a substance which is ruptured by thermal expansion. Examples of the substance which forms the shell include a vinylidene chloride-acrylonitrile copolymer, polyvinyl alcohol, polyvinyl butyral, polymethyl methacrylate, polyacrylonitrile, polyvinylidene chloride and polysulfone.

Thermally expandable microspheres can be produced by a conventional method, for example a coacervation method, an interfacial polymerization method or the like. For thermally expandable microspheres, commercial products such as, for example, series of trade name "Matsumoto Microsphere" (e.g., trade names "Matsumoto Microsphere F30", "Matsumoto Microsphere F301D", "Matsumoto Microsphere F50D", "Matsumoto Microsphere F501D", "Matsumoto Microsphere F80SD" and "Matsumoto Microsphere F80VSD", etc.) manufactured by Matsumoto Yushi-Seiyaku Co., Ltd., as well as trade names "051DU", "053DU", "551DU", "551-20DU" and "551-80DU" manufactured by Expancel Inc. can be used.

When thermally expandable microspheres are used as a foaming agent, the particle diameter (average particle diameter) of thermally expandable microspheres can be appropriately selected according to the thickness of the thermally expandable pressure-sensitive adhesive layer, or the like. The average particle diameter of thermally expandable microspheres can be selected within a range of 100 µm or less (preferably 80 µm or less, further preferably 1 µm to 50 µm, especially 1 µm to 30 µm). Adjustment of the particle diameter of thermally expandable microspheres may be performed in a process of generation of thermally expandable microspheres, or may be performed by a method such as classification after generation of thermally expandable microspheres. For thermally expandable microspheres, it is preferred that particle diameters are equalized.

(Other Foaming Agents)

In this embodiment, as the foaming agent, a foaming agent other than thermally expandable microspheres can also be used. Any of various kinds of foaming agents such as various inorganic foaming agents and organic foaming agents can be selected and used. Typical examples of the inorganic foaming agents include ammonium carbonate, ammonium hydrogen carbonate, sodium hydrogen carbonate, ammonium nitrite, boron sodium hydroxide and various kinds of azides.

Typical examples of the organic foaming agent include water; chlorofluoroalkane-based compounds such as trichloromonofluoromethane and dichloromonofluoromethane; azo-based compounds such as azobisisobutyronitrile, azodicarbonamide and barium azodicarboxylate; hydrazine-based compounds such as para-toluenesulfonyl hydrazide, diphenylsulfone-3,3'-disulfonyl hydrazide, 4,4'-oxybis(benzenesulfonyl hydrazide) and allylbis(sulfonyl hydrazide); semicarbazide-based compounds such as p-toluoylenesulfonyl semicarbazide and 4,4'-oxybis(benzenesulfonyl semicarbazide); triazole-based compounds such as 5-morpholyl-1,2,3, 4-thiatriazole; and N-nitroso-based compounds such as N,N'-dinitrosopentamethylenetetramine and N,N'-dimethyl-N,N'-dinitrosoterephthalamide.

In this embodiment, a foaming agent having proper strength such that the foaming agent is not ruptured until the volume expansion coefficient is increased by a factor of 5 or more, particularly 7 or more, especially 10 or more is preferred for efficiently and stably reducing the adhering strength of the thermally expandable pressure-sensitive adhesive layer by heating treatment.

The blending amount of the foaming agent (thermally expandable microspheres, etc.) can be appropriately set according to the expansion ratio and a reduction in adhering strength of the thermally expandable pressure-sensitive adhesive layer, but generally is, for example, 1 part by weight to 150 parts by weight (preferably 10 parts by weight to 130 parts by weight, further preferably 25 parts by weight to 100 parts by weight) based on 100 parts by weight of a base polymer that forms the thermally expandable pressure-sensitive adhesive layer.

In this embodiment, as the foaming agent, a foaming agent having a foaming start temperature (thermal expansion start temperature) (To) in a range of 80° C. to 210° C., preferably 90° C. to 200° C. (more preferably 95° C. to 200° C., especially preferably 100° C. to 170° C.) can be used. If the foaming start temperature of the foaming agent is lower than 80° C., the foaming agent may be foamed by heat generated during production or use of the sealed body or the ground body, leading to deterioration of handling characteristics and productivity. On the other hand, if the foaming start temperature of the foaming agent is higher than 210° C., excessive heat resistance is required for the support of the temporary fixing material or the sealing resin, and thus the foaming start temperature of higher than 210° C. is not preferred in terms of handling characteristics, productivity and costs. The foaming start temperature (To) of the foaming agent corresponds to the foaming start temperature (To) of the thermally expandable pressure-sensitive adhesive layer.

A method for foaming a foaming agent (i.e., method for thermally expanding the thermally expandable pressure-sensitive adhesive layer) can be appropriately selected from known methods of foaming under heating and employed.

In this embodiment, from the viewpoint of a balance between proper adhering strength before heating treatment and a degree of reduction in adhering strength after heating treatment, the thermally expandable pressure-sensitive adhesive layer has an elastic modulus of preferably $5\times10^4$ Pa to $1\times10^6$ Pa, further preferably $5\times10^4$ Pa to $8\times10^5$ Pa, especially preferably $5\times10^4$ Pa to $5\times10^5$ Pa at 23° C. to 150° C. in the form of not containing a foaming agent. If the elastic modulus (temperature: 23° C. to 150° C.) of the thermally expandable pressure-sensitive adhesive layer is less than $5\times10^4$ Pa in the form of not containing a foaming agent, thermal expandability may be deteriorated, leading to a degradation in peeling property. If the elastic modulus (temperature: 23° C. to 150° C.) of the thermally expandable pressure-sensitive adhesive layer is more than $1\times10^6$ Pa in the form of not containing a foaming agent, initial tackiness may be deteriorated.

The thermally expandable pressure-sensitive adhesive layer in the form of not containing a foaming agent corresponds to a pressure-sensitive adhesive layer formed of a pressure-sensitive adhesive (not containing a foaming agent). Therefore, the elastic modulus of the thermally expandable pressure-sensitive adhesive layer in the form of not containing a foaming agent can be measured using a pressure-sensitive adhesive (not containing a foaming agent). The thermally expandable pressure-sensitive adhesive layer can be formed from a pressure-sensitive adhesive capable of forming a pressure-sensitive adhesive layer having an elastic modulus of $5\times10^4$ Pa to $1\times10^6$ Pa at 23° C. to 150° C. and a thermally expandable pressure-sensitive adhesive containing a foaming agent.

The elastic modulus of the thermally expandable pressure-sensitive adhesive layer in the form of not containing a foaming agent is defined as a value of shear storage modulus G' which is obtained at 23° C. and 150° C. in the following manner. A thermally expandable pressure-sensitive adhesive layer with no foaming agent added thereto (i.e., pressure-sensitive adhesive layer formed of a pressure-sensitive adhesive which does not contain a foaming agent) (sample) is prepared, and a measurement is made in a sample thickness of about 1.5 mm at a frequency of 1 Hz, a temperature elevation rate of 5° C./minute and a distortion of 0.1% (23° C.) and 0.3% (150° C.) in a shear mode with a φ 7.9 mm parallel plate tool using a dynamic viscoelasticity measuring device "ARES" manufactured by Rheometric Inc.

The elastic modulus of the thermally expandable pressure-sensitive adhesive layer can be controlled by adjusting the type of a base polymer of a pressure-sensitive adhesive, a crosslinker, an additive and the like.

The thickness of the thermally expandable pressure-sensitive adhesive layer is not particularly limited, and can be appropriately selected according to the degree of reduction in adhering strength or the like, and is, for example, about 5 μm to 300 μm (preferably 20 μm to 150 μm). However, when thermally expandable microspheres are used as a foaming agent, the thickness of the thermally expandable pressure-sensitive adhesive layer is preferably larger than the maximum particle diameter of the thermally expandable microspheres contained therein. If the thickness of the thermally expandable pressure-sensitive adhesive layer is too small, surface smoothness is impaired due to the unevenness of the thermally expandable microspheres, so that tackiness before heating (in an unfoamed state) is reduced. In addition, the degree of deformation of the thermally expandable pressure-sensitive adhesive layer by heating treatment is small, and thus adhering strength is hard to be steadily reduced. On the other hand, if the thickness of the thermally expandable pressure-sensitive adhesive layer is too large, cohesion rupture may easily occur in the thermally expandable pressure-sensitive adhesive layer after expansion or foaming by heating treatment, leading to generation of an adhesive residue in the ground body 36.

The thermally expandable pressure-sensitive adhesive layer may be of a single layer or of multiple layers.

In this embodiment, the thermally expandable pressure-sensitive adhesive layer may contain various kinds of additives (e.g., a colorant, a thickener, an extender, a filler, a tackifier, a plasticizer, an anti-aging agent, an antioxidant, a surfactant, a crosslinker, etc.).

(Support)

The support 3b is a thin plate-shaped member which is a strength matrix of the temporary fixing material 3. The material of the support 3b may be appropriately selected in consideration of handling characteristics, heat resistance and the like, and for example, metal materials such as SUS, and plastic materials such as polyimide, polyamideimide, polyether ether ketone and polyethersulfone can be used. Among them, a SUS plate is preferred from the viewpoint of heat resistance, strength, reusability and the like.

The thickness of the support 3b can be appropriately selected in consideration of desired strength and handling characteristics, and is preferably 100 to 5000 μm, more preferably 300 to 2000 μm.

(Method for Formation of Temporary Fixing Material)

The temporary fixing material 3 is obtained by forming the thermally expandable pressure-sensitive adhesive layer 3a on the support 3b. The thermally expandable pressure-sensitive adhesive layer can be formed using, for example, a conventional method in which a pressure-sensitive adhesive, a foaming agent (thermally expandable microspheres, etc.), and solvents or other additives, etc. as necessary are mixed, and the mixture is formed into a sheet-shaped layer. Specifically, for example, the thermally expandable pressure-sensitive adhesive layer can be formed by a method in which a mixture containing a pressure-sensitive adhesive, a foaming agent (thermally expandable microspheres, etc.), and solvents or other additives as necessary are applied onto the support 3b; a method in which the aforementioned mixture is applied onto an appropriate separator (release paper, etc.) to form a thermally expandable pressure-sensitive adhesive layer, and the thermally expandable pressure-sensitive adhesive layer is transferred (displaced) onto the support 3b; or the like.

(Method for Thermally Expanding Thermally Expandable Pressure-Sensitive Adhesive Layer)

In this embodiment, the thermally expandable pressure-sensitive adhesive layer can be thermally expanded by heating. For example, the heating treatment method can be performed using appropriate heating means such as a hot plate, a hot air drier, a near infrared lamp or an air drier. The heating temperature during heating treatment may be equal to or higher than the foaming start temperature (thermal expansion start temperature) of a foaming agent (thermally expandable microspheres, etc.) in the thermally expandable pressure-sensitive adhesive layer, but conditions for heating treatment can be appropriately set according to the degree of decrease in bonding area associated with the type of a foaming agent (thermally expandable microspheres, etc.), and the like; the heat resistance of a support and a ground body including semiconductor chips, and the like; a heating method (heat capacity, heating means, etc.) and the like. General heating conditions include a temperature of 100° C. to 250° C. and a time of 1 second to 90 seconds (hot plate, etc.) or 5 minutes to 15 minutes (hot air drier, etc.). The heating treatment can be appropriately performed according to a use purpose. As a heat source during heating treatment, a near infrared lamp or heated water can be used in some cases.

(Intermediate Layer)

In this embodiment, an intermediate layer (not shown) may be provided between the thermally expandable pressure-sensitive adhesive layer 3a and the support 3b for the purpose of improving adhesive strength and the peeling property after heating. Particularly, as the intermediate layer, a rubber-like organic elastic intermediate layer is preferably provided. By providing the rubber-like organic elastic intermediate layer as described above, the bonding area can be increased by allowing the surface of the thermally expandable pressure-sensitive adhesive layer 3a to satisfactorily follow the surface shapes of the semiconductor chips 33 when the semiconductor chips 33 are bonded to the temporary fixing material 3 (see FIG. 4A), and the thermally expandable pressure-sensitive adhesive layer 3a can be preferentially and uniformly expanded in the thickness direction by controlling expansion under heating of the thermally expandable pressure-sensitive adhesive layer 3a to a high degree (with good accuracy) when the ground body 36 after grinding processing is peeled off under heating from the temporary fixing material 3.

The rubber-like organic elastic intermediate layer can be made to exist on one or both of the surfaces of the support 3b.

Preferably the rubber-like organic elastic intermediate layer is formed from, for example, natural rubber, a synthetic rubber or a synthetic resin having rubber elasticity, of which D Shore-D hardness based on ASTM D-2240 is 50 or less, especially 40 or less. A polymer which is essentially a hard polymer, like polyvinyl chloride, can exhibit rubber elasticity when combined with a compounding agent such as a plasticizer or a softening agent. Such a composition can be used as a constituent material of the rubber-like organic elastic intermediate layer.

The rubber-like organic elastic intermediate layer can be formed by, for example, a formation method such as a method in which a coating solution containing a rubber-like organic elastic layer forming material such as the aforementioned natural rubber, synthetic rubber or synthetic resin having rubber elasticity is applied onto a base material (coating method); a method in which a film formed of the rubber-like organic elastic layer forming material, or a laminated film, in which a layer formed of the rubber-like organic elastic layer forming material is formed beforehand on a thermally expandable pressure-sensitive adhesive layer having one or more layers, is bonded to a base material (dry laminate method); or a method in which a resin composition containing a constituent material of a base material and a resin composition containing the rubber-like organic elastic layer forming material are co-extruded (co-extrusion method).

The rubber-like organic elastic intermediate layer may be formed of an adherable substance having as a main component natural rubber, a synthetic rubber or a synthetic resin having rubber elasticity, or may be formed of a foamed film having such a component as a main component, or the like. Foaming can be performed by a conventional method, for example a method using mechanical stirring, a method using a reaction generation gas, a method using a foaming agent, a method of removing a soluble substance, a method using a spray, a method of forming a syntactic foam, a sintering method or the like.

The thickness of the intermediate layer such as a rubber-like organic elastic intermediate layer is, for example, 5 μm to 300 μm, preferably about 20 μm to 150 μm. In a case that the intermediate layer is, for example, a rubber-like organic elastic intermediate layer, if the thickness of the rubber-like organic elastic intermediate layer is too small, the peeling property may be deteriorated as a three-dimensional structural change after foaming under heating cannot be achieved.

The intermediate layer such as a rubber-like organic elastic intermediate layer may be a single layer, or may include two or more layers.

The intermediate layer may contain various kinds of additives (e.g., a colorant, a thickener, an extender, a filler, a tackifier, a plasticizer, an anti-aging agent, an antioxidant, a surfactant, a crosslinker, etc.) within the range of not impairing the action and effect of the temporary fixing material.

(Semiconductor Chip Arranging Step)

In a semiconductor chip arranging step, a plurality of semiconductor chips 33 are arranged on the temporary fixing material 3 (see FIG. 4A). For arranging the semiconductor chips 33, a known device such as a flip chip bonder or a die bonder can be used.

The layout of arrangement of the semiconductor chips 33 and the arrangement number thereof can be appropriately set according to the shape and size of the temporary fixing material 3, a desired production volume of packages, and the like, and for example, the semiconductor chips can be aligned in the form of a matrix having a plurality of rows and columns to be arranged.

(Sealing Step)

Figure 4B:
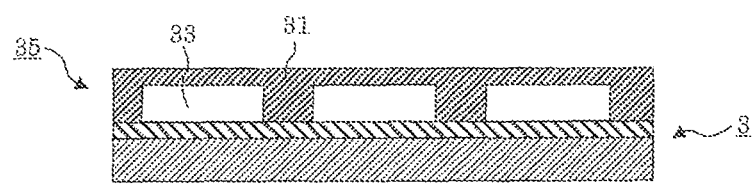
FIG. 4B is a sectional view schematically showing one step of a method for producing an electronic component package according to still another embodiment of the present invention.

In a sealing step, the sealing resin sheet 31 is laminated on the temporary fixing material 3 so as to cover a plurality of semiconductor chips 33, so that resin sealing is performed (see FIG. 4B). Conditions similar to those in the first embodiment can be employed in a method for laminating the sealing resin sheet 31 on the temporary fixing material 3.

(Sealed Body Forming Step)

In a sealed body forming step, the sealing resin sheet 31 is subjected to a heat curing treatment to form a sealed body 35 (see FIG. 4B). As conditions for the heat curing treatment of the sealing resin sheet 31, conditions similar to those in the first embodiment can be employed.

(Grinding Step)

Figure 4C:
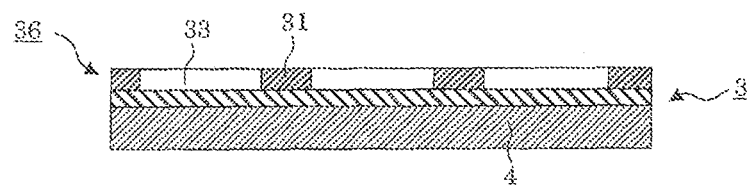
FIG. 4C is a sectional view schematically showing one step of a method for producing an electronic component package according to still another embodiment of the present invention.

In a grinding step, a ground body 36 is formed by grinding the surface of the sealed body 35 so that a ground surface of the sealing resin sheet after grinding of the sealed body 35 has a mean surface roughness Ra of 1 μm or less (see FIG. 4C). At the time of grinding, grinding is performed so that the semiconductor chips 33 are exposed as shown in FIG. 4C.

Grinding may be performed using a known grinder. In this embodiment, a predetermined sealing resin sheet is used, and therefore a ground surface of the sealing resin sheet 31 after grinding, which has a mean surface roughness Ra of 1 μm or less, can be efficiently achieved.

(Thermally Expandable Pressure-Sensitive Adhesive Layer Peeling Step)

Figure 4D:
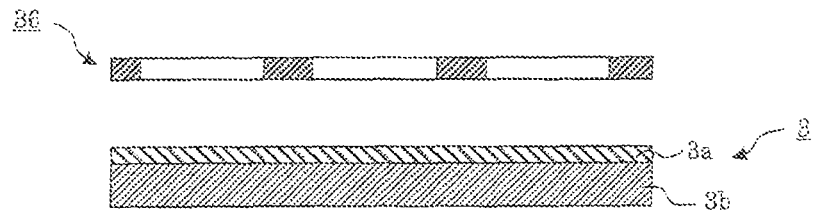
FIG. 4D is a sectional view schematically showing one step of a method for producing an electronic component package according to still another embodiment of the present invention.
Figure 4E:
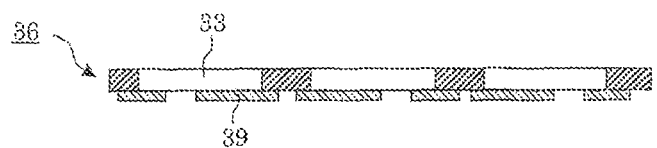
FIG. 4E is a sectional view schematically showing one step of a method for producing an electronic component package according to still another embodiment of the present invention.

In a thermally expandable pressure-sensitive adhesive layer peeling step, by heating the temporary fixing material 3 to thermally expand the thermally expandable pressure-sensitive adhesive layer 3a, peeling is performed between the thermally expandable pressure-sensitive adhesive layer 3a and the ground body 36 (see FIG. 4D). When the thermally expandable pressure-sensitive adhesive layer 3a is heated and thereby thermally expanded to reduce the adhesive strength thereof, peeling can be easily performed at an interface between the thermally expandable pressure-sensitive adhesive layer 3a and the ground body 36. As conditions for thermal expansion, the conditions in the section of "method for thermally expanding thermally expandable pressure-sensitive adhesive layer" described above can be suitably employed.

In this step, the surface of the ground body 36 may be cleaned by a plasma treatment or the like prior to a rewiring forming step in a state in which the semiconductor chips 33 are exposed.

(Rewiring Forming Step)

In this embodiment, preferably a rewiring forming step is further included. In the rewiring forming step, after the thermally expandable pressure-sensitive adhesive layer 3a is peeled off, and rewirings 39 that are connected to the exposed semiconductor chips 33 are formed on the ground body 36 (see FIG. 4E).

As a method for forming rewirings, for example, a metal seed layer can be formed on the exposed semiconductor chips 33 using a known method such as a vacuum deposition method, and the rewirings 39 can be formed by a known method such as a semi-additive method.

Thereafter, an insulating layer of polyimide, poly(p-phenylenebenzobisoxazole) (PBO) or the like may be formed on the rewirings 39 and the ground body 36.

(Bump Forming Step)

Figure 4F:
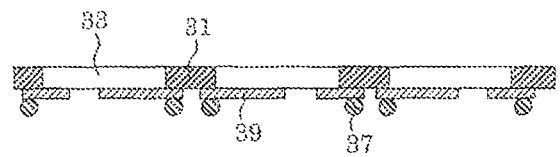
FIG. 4F is a sectional view schematically showing one step of a method for producing an electronic component package according to still another embodiment of the present invention.

Then, bumping processing may be performed for forming bumps 37 on the formed rewirings 39 (see FIG. 4F). Bumping processing can be performed by a known method such as a solder ball or solder plating. As a material of the bump 37, a material similar to that in the first embodiment can be suitably used.

(Dicing Step)

Figure 4G:
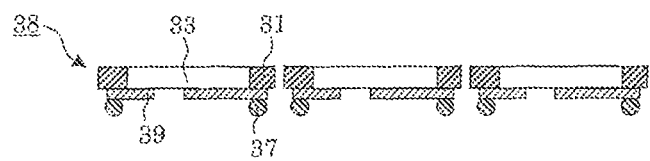
FIG. 4G is a sectional view schematically showing one step of a method for producing an electronic component package according to still another embodiment of the present invention.

Finally, dicing of a laminate including the semiconductor chips 33, the sealing resin sheet 31 and the rewirings 39 is performed (see FIG. 4G). Consequently, an electronic module 38 with a wiring drawn to outside a chip region can be obtained. As a dicing method, a method similar to that in the first embodiment can be employed.

EXAMPLES

Preferred Examples of the present invention will be illustratively described in detail below. However, for the materials, the blending amounts, and the like described in Examples, the scope of the present invention is not intended to be limited thereto unless definitely specified. The part(s) means "part(s) by weight".

Example 1

Preparation of Sealing Resin Sheet

The following components were blended by a mixer, melt-kneaded at 120° C. for 2 minutes by a biaxial kneader, and subsequently extruded from a T die to prepare a sealing resin sheet A having a thickness of 500 μm.

Epoxy resin: bisphenol F-type epoxy resin (YSLV-80XY (epoxy equivalent: 200 g/eq.; softening point: 80° C.) manufactured by Nippon Steel Chemical Co., Ltd.)
286 Parts Phenol resin: phenol resin having a biphenyl aralkyl backbone (MEH-7851-SS (hydroxyl equivalent: 203 g/eq.; softening point: 67° C.) manufactured by Meiwa Plastic Industries, Ltd.)
303 Parts Curing accelerator: imidazole-based catalyst as a curing catalyst (2PHZ-PW manufactured by Shikoku Chemicals Corporation)
6 Parts Inorganic filler: spherical fused silica powder (FB-9454 manufactured by DENKI KAGAKU KOGYO KABUSHIKI KAISHA; average particle diameter: 20 μm)
3695 Parts Silane coupling agent: epoxy group-containing silane coupling agent (KBM-403 manufactured by Shin-Etsu Chemical Co., Ltd.)
5 Parts Carbon black (#20 manufactured by Mitsubishi Chemical Corporation)
5 Parts Example 2

Preparation of Sealing Resin Sheet

The following components were blended by a mixer, melt-kneaded at 120° C. for 2 minutes by a biaxial kneader, and subsequently extruded from a T die to prepare a sealing resin sheet B having a thickness of 500 μm.

Epoxy resin: bisphenol F-type epoxy resin (YSLV-80XY (epoxy equivalent: 200 g/eq.; softening point: 80° C.) manufactured by Nippon Steel Chemical Co., Ltd.)
169 Parts Phenol resin: phenol resin having a biphenyl aralkyl backbone (MEH-7851-SS (hydroxyl equivalent: 203 g/eq.; softening point: 67° C.) manufactured by Meiwa Plastic Industries, Ltd.)
179 Parts Curing accelerator: imidazole-based catalyst as a curing catalyst (2PHZ-PW manufactured by Shikoku Chemicals Corporation)
6 Parts Elastomer: styrene-isobutylene-styrene triblock copolymer (SIBSTAR 072T manufactured by KANEKA CORPORATION)
152 Parts Inorganic filler: spherical fused silica powder (FB-9454 manufactured by DENKI KAGAKU KOGYO KABUSHIKI KAISHA; average particle diameter: 20 μm)
4400 Parts Silane coupling agent: epoxy group-containing silane coupling agent (KBM-403 manufactured by Shin-Etsu Chemical Co., Ltd.)
5 Parts Carbon black (#20 manufactured by Mitsubishi Chemical Corporation)
5 Parts Flame retardant: phosphazene compound (FP-100 manufactured by FUSHIMI Pharmaceutical Co., Ltd.)
89 Parts

Comparative Example 1

Preparation of Sealing Resin Sheet

The following components were dissolved or dispersed in methyl ethyl ketone to prepare a varnish having a solid content of 40% by weight.

Liquid epoxy resin (EXA-4850-150 manufactured by DIC Corporation)
80 Parts
Solid epoxy resin (EPPN-501-HY manufactured by Nippon Kayaku Co., Ltd.)
20 Parts
Phenol resin: phenol resin having a biphenyl aralkyl backbone
(MEH-7851-SS (hydroxyl equivalent: 203 g/eq.; softening point: 67° C.) manufactured by Meiwa Plastic Industries, Ltd.)
60 Parts
Curing accelerator: imidazole-based catalyst as a curing catalyst (2PHZ-PW manufactured by Shikoku Chemicals Corporation)
3 Parts
Acrylic copolymer (*)
330 Parts
Inorganic filler: spherical fused silica powder (FB-9454 manufactured by DENKI KAGAKU KOGYO KABUSHIKI KAISHA; average particle diameter: 20 μm)
750 Parts
Carbon black (#20 manufactured by Mitsubishi Chemical Corporation)
7 Parts The acrylic copolymer (*) is a copolymer formed of BA (butyl acrylate):AN (acrylonitrile):GMA (glycidyl methacrylate)=85:8:7 (% by weight) and has a weight average molecular weight of 800000. The acrylic copolymer was synthesized in the manner described below. Butyl acrylate, acrylonitrile and glycidyl methacrylate were charged in a weight ratio of 85:8:7, and radically polymerized at 70° C. for 5 hours and 80° C. for 1 hour under a nitrogen stream in ethyl methyl ketone using 2,2'-azobisisobutyronitrile as a polymerization initiator to obtain a desired acrylic copolymer.

The varnish was applied onto a PET film subjected to a mold release treatment so that the thickness of a coated film after drying of the solvent was 50 μm, and the coated film was dried at 120° C. for 3 minutes to obtain a resin sheet having a thickness of 50 μm. The obtained resin sheet was laminated to a thickness of 500 μm using a laminator to prepare a sealing resin sheet C.

(Measurement of Tensile Storage Modulus and Glass Transition Temperature (Tg) of Sealing Resin Sheet)

The measurement of a tensile storage modulus was performed using a solid viscoelasticity measuring device (Model: RSA-III manufactured by Rheometric Scientific, Inc). Specifically, each sealing resin sheet was heated at 180° C. for 1 hour to be thermally cured, a measurement sample having a sample size of 400 mm (length)×10 mm (width)×200 μm (thickness) was obtained from the cured product, the measurement sample was then set in a tool for film tension measurement, a tensile storage modulus and a loss elastic modulus in a temperature range of −50 to 300° C. were measured under conditions of a frequency of 1 Hz and a temperature elevation rate of 10° C./minute, and values of tensile storage modulus (E') at 25° C. and 100° C. were read. The value of tan δ (G" (loss elastic modulus)/G' (storage modulus)) in the above-mentioned measurement was calculated to determine a glass transition temperature (Tg).

(Measurement of Shore D Hardness of Sealing Resin Sheet)

Each sealing resin sheet was heated at 180° C. for 1 hour to be thermally cured, a measurement was then performed in accordance with JIS K 7215 using a hardness meter (Hardness Meter for Plastic manufactured by Mitutoyo Corporation), and a measured value at 100° C. was read.

(Preparation of Semiconductor Package)

Semiconductor chips of the following specifications were mounted on a BT substrate under the bonding conditions described below to prepare a semiconductor chip mounting substrate.

<Semiconductor Chip>
Semiconductor chip size: 7.3 mm² (thickness 400 μm)
Bump material: Cu 30 μm, Sn—Ag thickness 15 μm
Bump number: 544 bumps
Bump pitch: 50 μm
Chip number: 16 pieces (4 pieces×4 pieces)

<Bonding Conditions>
Device: manufactured by Panasonic Electric Works Co., Ltd.
Bonding conditions: 150° C., 49 N, 10 seconds Each of sealing resin sheets A to C was attached on the obtained semiconductor chip mounting substrate by vacuum pressing under the heating/pressing conditions shown below.

<Attachment Conditions>
Temperature: 90° C.
Pressing force: 0.5 MPa
Degree of vacuum: 2000 Pa
Pressing time: 3 minutes After releasing to atmospheric pressure, the sealing resin sheet was heat-cured in a hot air dryer at 180° C. for 1 hour to obtain a sealed body. Then, by grinding using a grinder (Surface Planer "DFS8910" manufactured by DISCO Corporation), the sealed body was thinned to a thickness of 150 μm together with semiconductor chips under conditions of a grind bite peripheral velocity of 1000 m/minute, a feed pitch of 100 μm and a cut depth of 10 μm to prepare a semiconductor package.

(Evaluation of Appearance of Ground Surface)

Presence or absence of sticking of a resin (dragging of a resin) to the surface of the semiconductor chip was observed with an optical microscope (200×), and an assessment made with "○" assigned when sticking of the resin to the surface was not observed for any of the semiconductor chips, and "X" assigned when sticking of the resin to the surface was observed for at least one of the semiconductor chips.

(Measurement of Mean Surface Roughness Ra of Ground Surface)

The surface roughness (Ra) of the sealing resin sheet part of the semiconductor package obtained after grinding was measured based on JIS B 0601 using a surface shape measuring device (Dektak 8M) manufactured by Veeco Corporation. Measurement conditions were as follows: room temperature and a measurement speed of 5 μm/s. Various measurement results and evaluation results are shown in Table 1.

TABLE 1

|  | Example 1 | Example 2 | Comparative Example 1 |
|---|---|---|---|
| Amount of inorganic filler (% by weight) | 86 | 88 | 60 |
| Surface roughness Ra after grinding (μm) | 0.08 | 0.2 | 1.3 |
| Tensile storage modulus at 25° C. (GPa) | 6 | 3 | 0.6 |

TABLE 1-continued

|  | Example 1 | Example 2 | Comparative Example 1 |
|---|---|---|---|
| Tensile storage modulus at 100° C. (GPa) | 3.2 | 1.1 | 0.1 |
| Shore D hardness at 25° C. | 93 | 88 | 71 |
| Shore D hardness at 100° C. | 85 | 77 | 40 |
| Glass transition temperature (° C.) | 128 | 117 | 90 |
| Appearance of ground surface (dragging of resin) | Absence | Absence | Presence |
| Assessment | ○ | ○ | X |

As is evident from Table 1, in Examples 1 and 2, sticking (dragging) of the resin to the surface of the exposed semiconductor chip was not observed even when grinding was performed after the sealing resin sheet was heat-cured, and semiconductor packages each having a clean surface could be prepared. Further, since the mean surface roughness Ra after grinding was 1 µm or less, the surface of the semiconductor package was excellent in smoothness. On the other hand, the semiconductor package of Comparative Example 1 was poor in both cleanliness and smoothness of the surface of the semiconductor package because sticking of the resin to the surface of the semiconductor chip after grinding was observed and the mean surface roughness Ra was more than 1 µm.

What is claimed is:

1. A sealing resin sheet, wherein
a ground surface has a mean surface roughness Ra of 1 µm or less when grinding is performed under conditions of a grind bite peripheral velocity of 1000 m/minute, a feed pitch of 100 µm and a cut depth of 10 µm after a heat curing treatment is performed at 180° C. for 1 hour; and
a Shore D hardness at 100° C. after the heat curing treatment is 70 or more.

2. The sealing resin sheet according to claim 1, wherein a Shore D hardness at 25° C. after the heat curing treatment is 70 or more.

3. The sealing resin sheet according to claim 1, wherein a tensile storage modulus at 25° C. after the heat curing treatment is 1 GPa or more.

4. The sealing resin sheet according to claim 1, wherein a tensile storage modulus at 100° C. after the heat curing treatment is 0.5 GPa or more.

5. The sealing resin sheet according to claim 1, wherein a glass transition temperature after the heat curing treatment is 100° C. or higher.

6. A method for producing an electronic component package, comprising:
a sealing step of sealing an electronic component with the sealing resin sheet according to claim 1;
a sealed body forming step of forming a sealed body by heat-curing the sealing resin sheet; and
a grinding step of forming a ground body by grinding a surface of the sealed body so that a ground surface of the sealing resin sheet after grinding of the sealed body has a mean surface roughness Ra of 1 µm or less.

7. The method for producing the electronic component package according to claim 6, further comprising a dicing step of forming an electronic module by dicing the ground body.

8. The method for producing the electronic component package according to claim 6, wherein the electronic component is a semiconductor chip.

9. The method for producing the electronic component package according to claim 6, wherein the electronic component is a semiconductor wafer.

10. An electronic component package, which is obtained by the method for producing an electronic component package according to claim 6.

* * * * *